(12) United States Patent
Zeng et al.

(10) Patent No.: US 9,646,950 B2
(45) Date of Patent: May 9, 2017

(54) CORROSION-RESISTANT COPPER BONDS TO ALUMINUM

(71) Applicant: Texas Instruments Incorporated, Dallas, TX (US)

(72) Inventors: Kejun Zeng, Coppell, TX (US); Amit Sureshkumar Nangia, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/012,907

(22) Filed: Feb. 2, 2016

(65) Prior Publication Data
US 2016/0181225 A1 Jun. 23, 2016

Related U.S. Application Data

(62) Division of application No. 14/574,588, filed on Dec. 18, 2014, now abandoned.

(51) Int. Cl.
*H01L 23/00* (2006.01)
*H01L 21/56* (2006.01)

(52) U.S. Cl.
CPC .............. *H01L 24/85* (2013.01); *H01L 21/56* (2013.01); *H01L 24/48* (2013.01); *H01L 24/05* (2013.01); *H01L 2224/04042* (2013.01); *H01L 2224/05624* (2013.01); *H01L 2224/45144* (2013.01); *H01L 2224/45147* (2013.01); *H01L 2224/4845* (2013.01); *H01L 2224/48227* (2013.01); *H01L 2224/48507* (2013.01); *H01L 2224/48824* (2013.01); *H01L 2224/85035* (2013.01); *H01L 2224/85205* (2013.01); *H01L 2224/85948* (2013.01); *H01L 2924/00014* (2013.01); *H01L 2924/3862* (2013.01)

(58) Field of Classification Search
CPC ....... H01L 2924/00014; H01L 2924/00; H01L 2224/73265; H01L 2224/48227; H01L 2924/181
See application file for complete search history.

(56) References Cited

U.S. PATENT DOCUMENTS

| | | | |
|---|---|---|---|
| 6,223,429 B1 * | 5/2001 | Kaneda | H01L 23/3121 174/260 |
| 2008/0203568 A1 | 8/2008 | Tanaka et al. | |
| 2009/0026605 A1 * | 1/2009 | Gupta | H01L 23/3677 257/712 |
| 2012/0001336 A1 * | 1/2012 | Zeng | H01L 24/05 257/769 |

* cited by examiner

*Primary Examiner* — Andy Huynh
(74) *Attorney, Agent, or Firm* — Jacqueline J. Garner; Charles A. Brill; Frank D. Cimino

(57) ABSTRACT

A method for fabricating a semiconductor device is disclosed. A packaged semiconductor device is provided having copper ball bonds attached to aluminum pads. The packaged device is treated for at least one cycle at a temperature in the range from about 250° C. to 270° C. for a period of time in the range from about 20 s to 40 s.

15 Claims, 2 Drawing Sheets

CORROSION-RESISTANT COPPER BONDS TO ALUMINUM

CROSS REFERENCE TO RELATED APPLICATIONS

This application is a Divisional of and claims priority to U.S. application Ser. No. 14/574,588, filed Dec. 18, 2014. Said application incorporated herein by reference in its entirety.

FIELD

Embodiments of the invention are related in general to the field of semiconductor devices and processes, and more specifically to the structure and wafer-scale fabrication method of corrosion-resistant copper ball bonds to aluminum.

DESCRIPTION OF RELATED ART

For decades, is has been common practice in the semiconductor device industry to connect the aluminum terminals of components in semiconductor chips by gold wires to the metal pads of substrates. In the interconnection bonding process, a free air ball of gold is first formed by melting the wire end protruding from the tip of a bonding capillary. The capillary brings the hot gold ball into contact with the aluminum terminal. Applying mechanical force and ultrasonic energy for several milliseconds, the gold ball is squashed against the aluminum to form gold-aluminum intermetallic compounds. These compounds are mechanically and chemically strong and satisfy stringent reliability and usage tests involving temperature excursions, humid environment and mechanical shock. The capillary then pulls the wire in an arch to the substrate pad and stitches the opposite wire end onto the pad metal.

In the last several years, the price of gold has skyrocketed and forced the industry to search for less expensive alternatives to the gold wire. The favored choices are copper wires; copper offers the additional benefit of almost 32% better electrical conductivity compared to gold. For the interconnection process, a ball bonding technique analogous to the gold-aluminum scheme is used. However, the copper-aluminum intermetallic compounds formed in the process are thinner and mechanically less robust than the gold-aluminum intermetallic compounds. In addition, the compounds of a copper-aluminum interface are sensitive to ubiquitous but chemically aggressive elements such as chlorine (from assembly and packaging processes, molding compounds, etc.) so that the compounds succumb readily to corrosion, especially together with moisture.

Careful cleanup efforts are underway in the semiconductor industry, for instance reducing the chlorine content in molding compounds to <30 ppm, washing semiconductor wafers at sawing, washing chips on leadframe strips before wire bonding, and avoiding contamination during handling and assembly.

SUMMARY

Applicants realized that semiconductor packages cannot be completely free of chlorine, since chlorine is involved in certain wafer manufacturing processes; further, molding compounds and laminate substrates may contain low ppm levels of chlorine; and leadframes may have chlorine in surface coatings because the plating baths contain chlorine. In short, efforts to make assembly and packaging systems cleaner are important but not enough.

It is equally important to prevent chlorine from migrating into metal interfaces and concentrating to the level at which corrosion of the copper-aluminum intermetallic compounds between copper ball and aluminum pad, or even the aluminum pad itself is triggered. Applicants solved the problem of copper-aluminum intermetallic corrosion even in relatively cleaned-up systems when they discovered a methodology of growing the intermetallic layer to a thickness where the interfacial bonding is so strong that the probability of crevice formation in the interface is reduced. In the methodology, continuous intermetallic layers of $CuAl_2$ and $Cu_9Al_4$ are grown by one or more cycles at temperatures between 250 and 270° C. and time periods from 20 to 40 s.

According to the model, crevices provide the mechanism in the interface to make the electrolyte more acidic and increase the chlorine ion concentration. When the interface of copper ball and aluminum pad cracks due to a weak intermetallic layer, or when there exists a narrow gap, moisture can migrate into the gap, but cannot flow since the narrow crack resists solution flow. More metal ions $Al^{+3}$ are generated than $OH^-$ ions. Chloride ions are dragged into the gap, and the pH value of the solution in the gap is decreased. As a consequence, $Al_2O_3$ is destabilized and corrosion starts. Bias voltage and elevated temperatures promote corrosion. Once the corrosion of the intermetallic compound $Cu_9Al_4$ gets started, it propagates quickly.

DETAILED DESCRIPTION OF THE PREFERRED EMBODIMENTS

Figure 1A:
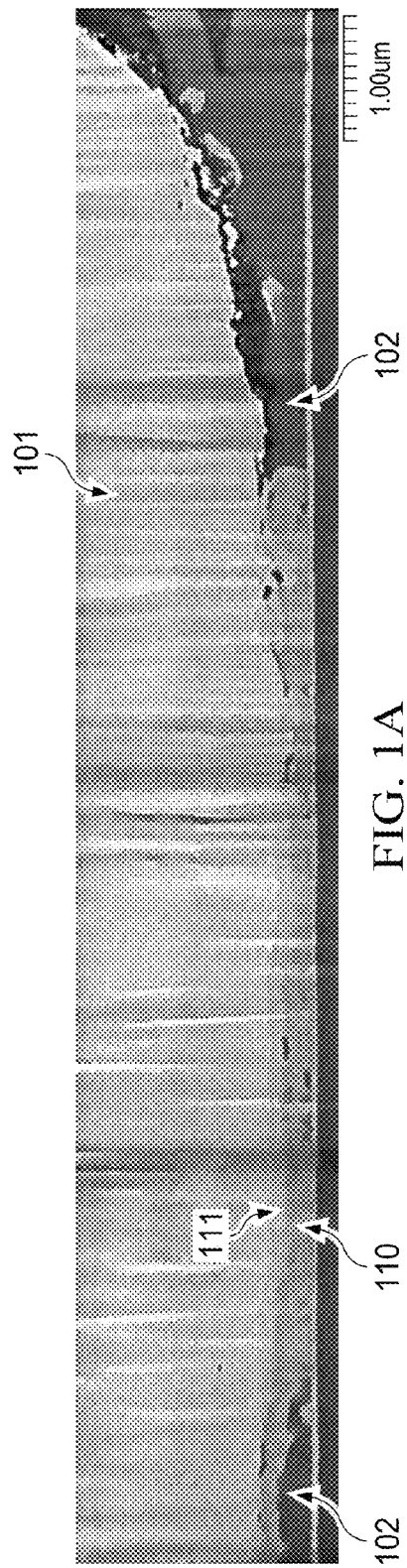
FIG. 1A illustrates a cross section of a copper ball bond to an aluminum pad according to the invention, the bond including two distinct layers of copper-aluminum intermetallic compounds; layer IMC1 is $CuAl_2$ and layer IMC2 is $Cu_9Al_4$. Magnification 40,000×.
Figure 1B:
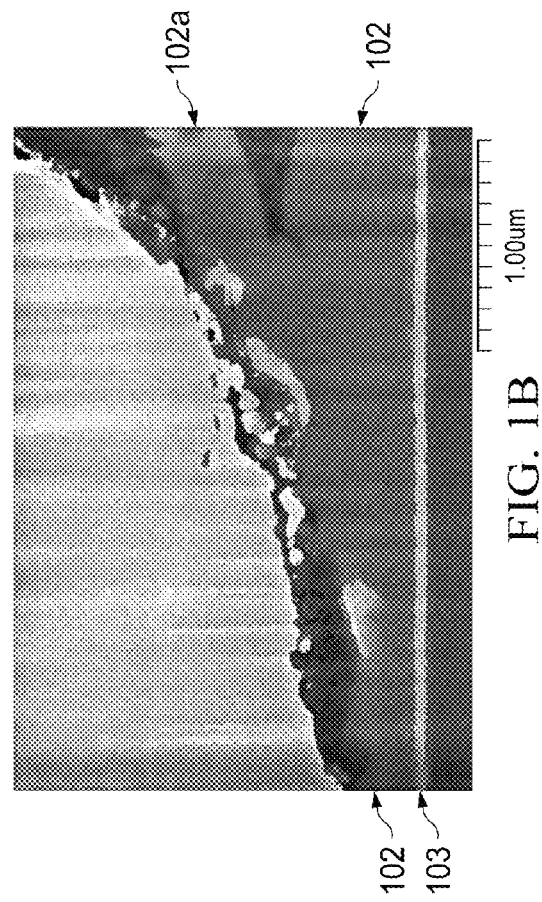
FIG. 1B depicts an enlarged view of a portion of the cross section of FIG. 1A.

As an exemplary embodiment of the invention, FIG. 1A illustrates a cross section of a portion of a copper ball bond on an aluminum pad at high magnification (40,000×). The cross section was obtained by cutting through the sample vertically relative to the plane of the pad. The total length of the cross section shown in FIG. 1A is about 50 µm. The portion shown depicts the squashed ball 101 from its concave curving transiting into the flat section of the squashed ball, which extends parallel to the aluminum pad 102. The enlargement of FIG. 1B shows the thin barrier layer 103, which insures good adhesion to the underlying silicon of the aluminum layer. Preferably, barrier metals for layer 103 are selected from a group of refractory metals including titanium, tungsten, molybdenum, tantalum, chromium, and compounds thereof.

Along the flat portion between the surface of the copper ball and the surface of the aluminum pad, FIG. 1A depicts two layers 110 and 111 of copper-aluminum intermetallic compounds. As the cross section shows, layer 110 and layer 111 are two approximately parallel and continuous. An analysis has revealed that layer 110 is the intermetallic compound $CuAl_2$, and layer 111 is the intermetallic compound $Cu_9Al_4$. Together, both layers have in the example of FIG. 1A a combined average thickness of about 273 nm.

It should be pointed out that herein the layers of intermetallic compounds are called continuous over the contact area even when they may annex a few localized discontinuities. The localized discontinuity may affect only one layer, or it may affect both layers. These localized discontinuities or gaps are only in restricted, narrow locations, but do not disturb or disrupt the overall continuity of the intermetallic layers.

Another embodiment of the invention is a method for fabricating a semiconductor device with copper ball bonds to aluminum pads, encapsulating the device in a package, and subjecting the packaged device to thermal treatments. Certain processes are summarized in FIG. 3. The method starts by attaching a semiconductor chip with aluminum bond pads on a substrate such as a metal leadframe (preferably a strip of substrate to enable batch processing). The assembly is placed on a hot stage to raise the chip to a first temperature between about 200 and 250° C. It is preferred to have the bonding process performed in a reducing atmosphere such as dry nitrogen gas with a few percent hydrogen gas.

The copper wire is strung through a capillary. A copper free air ball 101 is formed from the wire end piece protruding from the capillary tip. At the beginning of the bonding process, the still hot copper free air ball is brought to contact with the aluminum pad 102. The surfaces of the copper ball and the aluminum substrate 101 are free of contaminants such as oxides, insulating layers, and particulate impurities. The impact may create few aluminum splashes 102a. The contact between copper ball and aluminum pad is achieved while a mechanical force is pressing on the copper ball and squashing it, and while energy is applied to the contact. One portion of the energy is thermal, provided by the hot stage at elevated temperature between about 165 and 250° C., and the other portion is ultrasonic energy, provided by the ultrasonic movement of the capillary tip relative to the aluminum pad. During the attachment process, the substrate strip remains on the hot stage for a period of time between about 2 and 30 minutes.

Throughout a period of time (between about 10 and 20 ms) since the ultrasonic movement is turned on, thermal and ultrasonic energy have caused interdiffusion and chemical reaction of copper and aluminum atoms at the interface to create islands and then layers of intermetallic compounds in the thickness range from about 50 to 100 nm. While six copper/aluminum intermetallic compounds are known, the dominant compounds include $CuAl_2$ at the side of the aluminum pad 102, and $Cu_9Al_4$ at the side of the copper ball 101; in addition, CuAl may be formed between these compounds when the time span of ultrasonic agitation is sufficiently long.

In the next process, the chip with the bond pad and the squashed ball of the bonding wire, and at least portions of the substrate are encapsulated in a packaging compound, preferably a thermoset molding compound. The encapsulated devices are then subjected to a temperature of about 175° C. for about 5 to 6 h in order to polymerize the plastic packaging compound. A plurality of packaged devices with copper bonds to aluminum pads is provided for the next processes (process 301 in FIG. 3).

Figure 3:
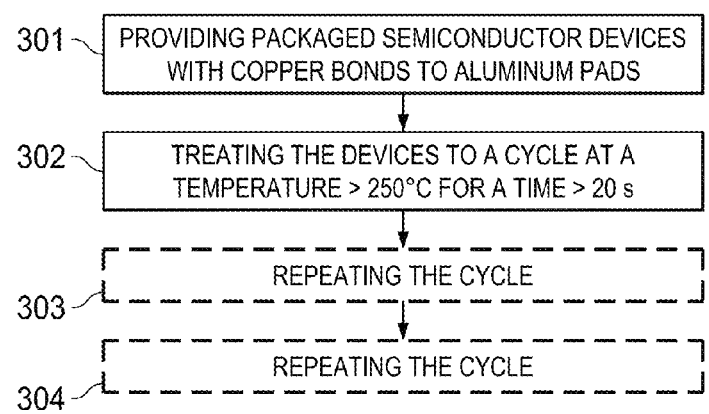
FIG. 3 is a flow diagram of a portion of the methodology of growing continuous intermetallic layers for copper bonds on aluminum, which are robust enough to prevent crevice formation and corrosion.

Preferably without waiting for singulating the substrate strip into discrete units, the strips of packaged devices are treated at a second temperature for a second period of time (process 302 in FIG. 3). It facilitates device fabrication, when the second temperature and the second time period are selected to be the same as the temperature and time periods required for reflowing solder alloys such as tin-silver alloys. Generally, it is preferred that the second temperature is in the range from 230° C. to 270° C., or more preferred between 250° C. and 270° C. The second time period is preferably between about 20 s and 40 s, dependent on the second temperature employed. A thermal treatment in these confines creates continuous yet thin layers rather than just islands of copper-aluminum intermetallic compounds.

Detailed investigations of copper ball bonds on aluminum pads have shown that already one of these thermal treatments creates continuous, although thin, layers of intermetallic compounds. The continuous layers of intermetallic compounds can be significantly strengthened by repeating the cycle one or several times. As an example, the intermetallic layers of FIGS. 1A and 1B have been created by three consecutive thermal cycles. The repetition of thermal treatment is indicated in FIG. 3 by dashed outlines of process step 303 up to the n-th repetition at process 304.

On the other hand, in thermal treatments such as a cycle at 125° C. for 24 h, or a cycle at 30° C. for 192 h, the growth of intermetallic compounds is very slow and often not continuous. Experiments have shown that generally the growth is slow at temperatures <180° C.

Figure 2:
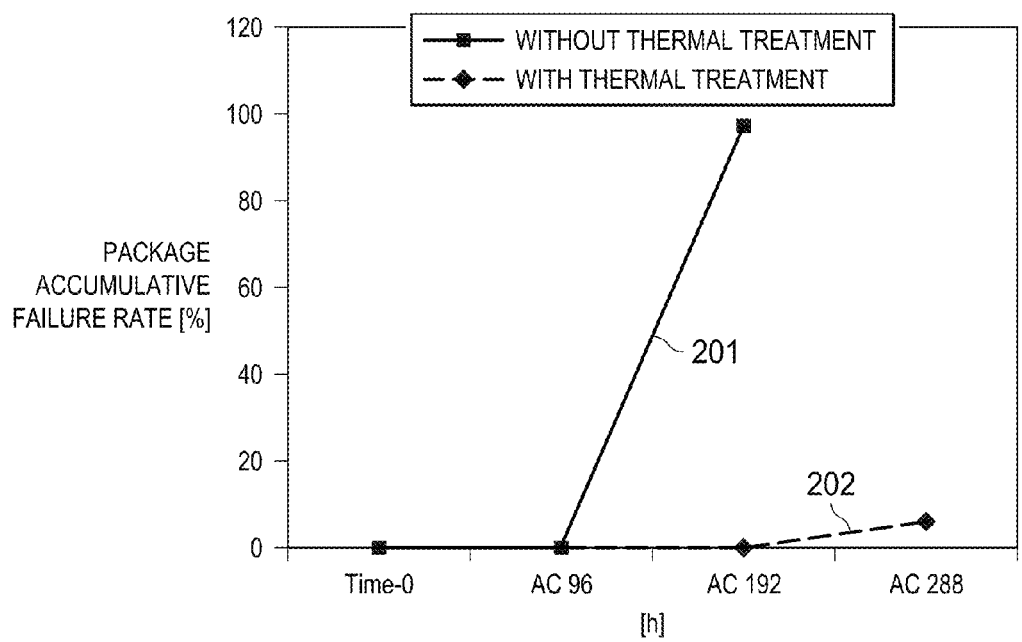
FIG. 2 shows a diagram of cumulative failure rate (in %) of copper-aluminum bonds as a function of time (in hours) in reliability tests of bonds without and with thermal treatment according to the invention.

Semiconductor devices with copper ball bonds with continuous intermetallic layers between copper ball and aluminum pad have been subjected to conventional reliability tests, including highly accelerated stress tests. FIG. 2 shows a diagram of cumulative failure rate (in %) of copper-aluminum bonds as a function of time (in hours) in reliability tests of bonds without thermal treatment (curve 201) and with thermal treatment (curve 202) according to the invention. The tests included the demanding HAST (highly accelerated stress tests with high humidity, elevated temperature and electrical bias). The data of FIG. 2 demonstrate that device reliability is significantly improved by continuous layers of intermetallic copper-aluminum compounds, which include layers of $CuAl_2$ and $Cu_9Al_4$.

In an effort to explain the beneficial result of significantly reduced failure rates in devices with thermal treatment of copper bonds on aluminum pads, a model has been developed based on the fact that semiconductor packages cannot be completely free of chlorine. The model states that, while efforts to make assembly and packaging systems cleaner are important, chlorine has to be prevented from migrating into metal interfaces and concentrating to the level at which corrosion of the copper-aluminum intermetallic compounds between copper ball and aluminum pad, or even the aluminum pad itself is triggered. When the interface of copper ball and aluminum pad cracks due to a weak intermetallic layer, or when there exists a narrow gap, moisture can migrate into the gap, but cannot flow since the narrow crack resists solution flow. More metal ions $Al^{+3}$ are generated than $OH^-$ ions. Chloride ions are dragged into the gap, and the pH value of the solution in the gap is decreased. As a consequence, $Al_2O_3$ is destabilized and corrosion starts. Bias voltage and elevated temperatures promote corrosion. Once the corrosion of the intermetallic compound $Cu_9Al_4$ gets started, it propagates quickly.

With thermal treatment, the intermetallic layers have to be grown to a thickness where the interfacial bonding is so strong that the probability of crevice formation in the interface is practically eliminated. The suppression of crevice formation in the interface also suppresses the mechanism of making the electrolyte more acidic and increasing the chlorine ion concentration.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the aluminum of the bond pad may include alloys with other metals, for instance a small percentage of copper, nickel, or gold. As another example, the copper of the squashed ball may include alloys with other metals, for instance silver, zinc, or nickel.

As another example, the thermal treatment may include other cycles of temperature and time periods, even in high humidity environment.

It is therefore intended that the appended claims encompass any such modification.

We claim:

1. A method for packaging a semiconductor chip, comprising:
    creating a wire bond between an aluminum pad on the semiconductor chip and a copper wire, at a first temperature for a first time period, the semiconductor chip being on a substrate strip;
    encapsulating portions of the wire bond, the aluminum pad and the semiconductor chip using a packaging compound creating a packaged device; and
    treating the packaged device on the substrate strip at a second temperature for a second time period.

2. The method of claim 1, wherein the second temperature is between 250° C. to 270° C.

3. The method of claim 1, wherein the second time period is between 20 seconds and 40 seconds.

4. The method of claim 1, wherein the first temperature is between about 165° C. and 250° C. and the first period of time between 10 milliseconds and 20 milliseconds.

5. The method of claim 1, comprising polymerizing the packaging compound at a temperature of about 175° C.

6. The method of claim 1, comprising polymerizing the packaging compound for a time between 4 hours to 6 hours.

7. The method of claim 1 further comprising repeating the step of treating.

8. The method of claim 1, wherein the layer of copper-aluminum intermetallic compound is a continuous layer having a thickness.

9. The method of claim 1, wherein the layer of copper-aluminum intermetallic compound is about 273 nanometers thick.

10. A method for packaging a semiconductor chip, comprising:
    heating a semiconductor chip having an aluminum bond pad to a first temperature, the semiconductor chip being on a substrate strip;
    forming a ball from a copper wire;
    contacting the ball to the aluminum bond pad and applying force and ultrasonic energy to the ball for a first period of time to squash and attach the ball to the pad;
    encapsulating the semiconductor chip, the aluminum bond pad, and the squashed ball in a packaging compound;
    polymerizing the packaging compound; and
    treating the packaged device at a temperature between 250° C. to 270° C. for a second time period between 20 seconds to 40 seconds before singulating the substrate strip.

11. The method of claim 10, wherein the first temperature is between about 165° C. and 250° C. and the first period of time between 10 milliseconds and 20 milliseconds.

12. The method of claim 10 further comprising singulating the substrate strip.

13. The method of claim 10, wherein the treating forms a plurality of layers of copper-aluminum intermetallic compound between the squashed ball and the aluminum bond pad.

14. The method of claim 13, wherein the plurality of layers of copper-aluminum intermetallic compound includes a $CuAl_2$ intermetallic compound layer.

15. The method of claim 13, wherein the plurality of layers of copper-aluminum intermetallic compound includes a $Cu_9Al_4$ intermetallic compound layer.

* * * * *